(12) United States Patent
Chen et al.

(10) Patent No.: US 8,358,515 B2
(45) Date of Patent: Jan. 22, 2013

(54) LOW NOISE BLOCK CONVERTER

(75) Inventors: Ruei Yuen Chen, Hsinchu (TW); Hsiang Hao Sung, Hsinchu (TW)

(73) Assignee: Microelectronics Technology, Inc., Hsinchu (TW)

( * ) Notice: Subject to any disclaimer, the term of this patent is extended or adjusted under 35 U.S.C. 154(b) by 204 days.

(21) Appl. No.: 12/875,389

(22) Filed: Sep. 3, 2010

(65) Prior Publication Data
US 2011/0063810 A1 Mar. 17, 2011

(30) Foreign Application Priority Data
Sep. 15, 2009 (TW) .............................. 98216972 U

(51) Int. Cl.
*H05K 9/00* (2006.01)
(52) U.S. Cl. ........................................ 361/816; 361/799
(58) Field of Classification Search .......... 361/728–730, 361/752, 796, 800, 816, 818, 799; 174/35 R, 174/51, 352
See application file for complete search history.

(56) References Cited

U.S. PATENT DOCUMENTS

| | | | | |
|---|---|---|---|---|
| 4,901,203 A * | 2/1990 | Kobayashi et al. | ........... | 361/737 |
| 5,408,383 A * | 4/1995 | Nagasaka et al. | ............. | 361/707 |
| 5,945,836 A * | 8/1999 | Sayre et al. | .............. | 324/750.25 |
| 6,144,571 A * | 11/2000 | Sasaki et al. | ................... | 363/144 |
| 6,249,442 B1 * | 6/2001 | Watanabe | ...................... | 361/801 |
| 6,671,183 B2 * | 12/2003 | Tsuzuki | ......................... | 361/797 |
| 6,894,891 B2 * | 5/2005 | Darr et al. | ...................... | 361/601 |
| 7,999,358 B2 * | 8/2011 | Bakalski et al. | ............. | 257/659 |
| 8,102,670 B2 * | 1/2012 | Sakamoto et al. | ............ | 361/796 |
| 8,107,242 B2 * | 1/2012 | Yoshimoto et al. | ........... | 361/719 |
| 2003/0144026 A1 * | 7/2003 | Hirota et al. | ................... | 455/556 |
| 2003/0210524 A1 * | 11/2003 | Berg et al. | ...................... | 361/687 |
| 2008/0272749 A1 * | 11/2008 | Tanaka et al. | ................. | 323/233 |

* cited by examiner

*Primary Examiner* — Hung S Bui
(74) *Attorney, Agent, or Firm* — WPAT, P.C.; Anthony King

(57) ABSTRACT

A low noise block converter includes a first printed circuit board, a second printed circuit board, and a housing. The first printed circuit board includes a metal layer disposed on a surface of the first printed circuit board. The second printed circuit board includes at least one chip. The housing includes a support surface configured to support the first printed circuit board, and a cavity formed on the support surface and configured to receive the second printed circuit board, wherein the first printed circuit board is placed on the support surface with the metal layer facing the cavity for shielding the electromagnetic fields radiated from the at least one chip.

10 Claims, 3 Drawing Sheets

LOW NOISE BLOCK CONVERTER

BACKGROUND OF THE INVENTION

1. Field of the Invention

The present invention relates to a low noise block converter, and relates more particularly to a low noise block converter that is compact and designed to prevent electromagnetic interference between electronic components.

2. Description of the Related Art

Satellite communications requires equipment such as ground stations, low noise block down converters, transmission cables, and modulator/demodulators. The ground station receives radio frequency signals from satellites; the low noise block down converter amplifies the received radio frequency signals and converts the amplified radio frequency signals to intermediate frequency signals; and the transmission cables transmit the intermediate signals to the modulator/demodulator.

Generally, the low noise block down converter may include a radio frequency circuit and an intermediate circuit electrically connecting to the radio frequency circuit. The radio frequency circuit receives radio frequency signals, converts the radio frequency signals to intermediate signals, and transmits the intermediate signals to the intermediate circuit. When the radio frequency signals are processed, the electronic components may radiate electromagnetic waves, causing the electronic components to interfere with each other. In order to prevent the electronic components in a low noise block down converter from interfering with each other, a shield may be additionally disposed to minimize the electromagnetic interference between the electronic components. However, the addition of such a shield requires more space, increasing the weight and the manufacturing cost of the low noise block down converter.

In addition, most components of a low noise block down converter are made of metal. A larger low noise block down converter needs not only more material for construction but also a larger and stronger support for supporting it, and consequently, it becomes inconvenient to use and costs more to produce.

In view of the drawbacks of a traditional low noise block down converter, a new low noise block down converter that is designed compactly and has capability to prevent the electronic components therein from electromagnetically interfering with each other is required.

SUMMARY OF THE INVENTION

The present invention discloses a low noise block converter, which comprises a first printed circuit board, a second printed circuit board, and a housing. The first printed circuit board includes a metal layer that is disposed on a surface of the first printed circuit board. The second printed circuit board includes at least one chip, which may radiate an electromagnetic wave. The housing comprises a support surface and a cavity. The support surface is disposed within the housing and configured to support the first printed circuit board. The cavity is formed on the support surface and configured to receive the second printed circuit board. The first printed circuit board is disposed on the support surface with the metal layer facing the cavity for shielding the electromagnetic wave from the at least one chip.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
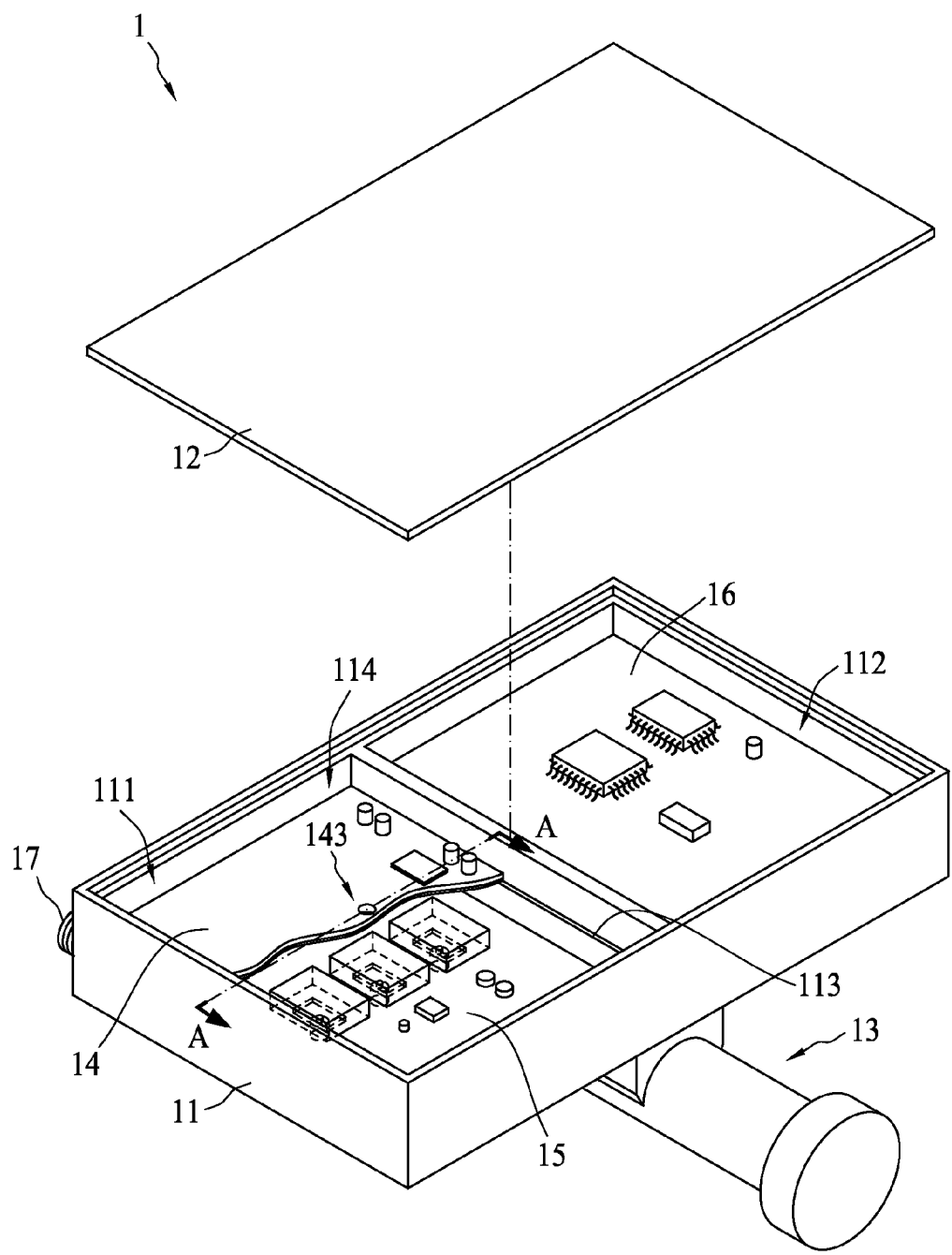
FIG. 1 is a perspective view showing a low noise block converter according to one embodiment of the present invention.

FIG. 1 is a perspective view showing a low noise block converter 1 according to one embodiment of the present invention. The low noise block converter 1 comprises a housing 11, a cover member 12, a feed horn 13, a first printed circuit board 14, a second printed circuit board 15, and a third printed circuit board 16. The feed horn 13 is configured to receive radio frequency signals from satellites. The housing 11 is configured to receive the first printed circuit board 14 configured to process the received radio frequency signals and to generate intermediate signals, the second printed circuit board 15, and the third printed circuit board 16. The feed horn 13 connects to the housing 11 for guiding radio frequency signals into the housing 11 for signal processing. The cover member 12 is configured to cover the housing 11 to protect the circuitry and the electronic components inside the housing from external electromagnetic interference. The cover member 12 can be fastened using fasteners such as bolts or screws, or using adhesive material, or other means well known by persons skilled in the art. A plurality of connecting elements 17 may be disposed on the exterior of the housing 11 for connecting cables for transmitting intermediate signals.

In the present embodiment, the interior of the housing 11 can be partitioned into a first compartment 111 and a second compartment 112. The first compartment 111 is configured to receive the first printed circuit board 14 and the second printed circuit board 15 while the second compartment 112 is configured to receive the third printed circuit board 16. Each of the first printed circuit board 14 and the second printed circuit board 15 may respectively include a portion of an intermediate circuit, and the third printed circuit board 16 may be a printed circuit board including a radio frequency circuit. Separating the intermediate circuit and the radio frequency circuit into two different first and second compartments 111 and 112 can minimize the electromagnetic interference between the intermediate circuit and the radio frequency circuit. In the present embodiment, the housing 11 may be made of, but is not limited to, aluminum.

Figure 2:
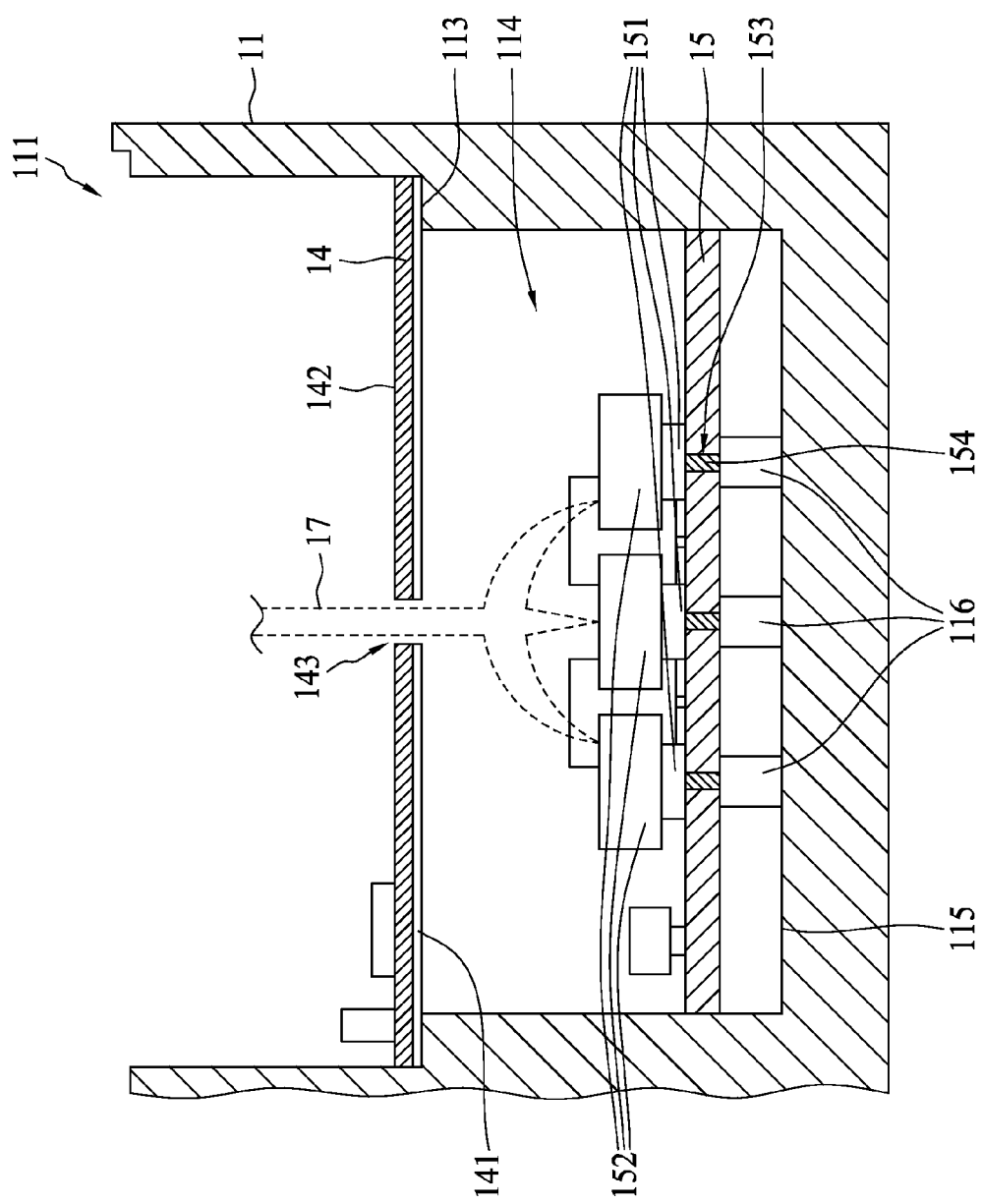
FIG. 2 is a cross-sectional view along line A-A of FIG. 1.

FIG. 2 is a cross-sectional view along line A-A of FIG. 1. Referring to FIGS. 1 and 2, the first compartment 111 may comprise a support surface 113 configured to support the first printed circuit board 14. A cavity 114 can be formed on the support surface 113 for receiving the second printed circuit board 15. When the second printed circuit board 15 is disposed within the cavity 114 and the first printed circuit board 14 is placed on the support surface 113, the first printed circuit board 14 and the second printed circuit board 15 are arranged in a stacking manner.

Particularly, the second printed circuit board 15 may comprise at least one chip 151. However, in the present embodiment, the second printed circuit board 15 can include, but is not limited to, three chips 151. When the chip 151 operates, it emits electromagnetic waves. If the electromagnetic waves are not properly shielded, the electronic components on the third printed circuit board 16 as shown in FIG. 1 may be interfered with by the electromagnetic waves. To minimize the influence of the electromagnetic waves, an absorbing material 152 can be provided on each chip 151. The absorbing material 152 can absorb a portion of radiated electromagnetic waves, but its electromagnetic shielding effectiveness is limited. Therefore, another electromagnetic shielding means is required. The absorbing material 152 can be foam material or other material for absorbing electromagnetic energy.

Specifically, on the second printed circuit board 15, through-holes 153 can be formed at the location where the chips 151 are disposed. The through-holes 153 correspond to the chips 151, and pass through the printed circuit board 15 from the surface on which the chip 151 is disposed to an opposite surface. Within each through-hole 153, a thermally conductive pillar 154 is disposed. The thermally conductive pillar 154 contacts a bottom surface of the chip 151 for conducting the heat generated by the chip 151. In one embodiment, the material of the thermally conductive pillar 154 can be copper.

Furthermore, a plurality of protrusions 116 may be provided on a bottom surface 115 defining the cavity 114. The protrusions 116 can be disposed with respect to the chips 151 and respectively contact the thermally conductive pillars 154 so that heat generated by the chips 151 can be conducted to the protrusions 116 via the thermally conductive pillars 154, and can then be dissipated by the housing 11 to the air surrounding the housing 11. In addition, the protrusion 116 can be configured to support the second printed circuit board 15. In the present embodiment, the second printed circuit board 15 may be a 6 layer printed circuit board.

Referring to FIG. 2, the first printed circuit board 14 is disposed above the second printed circuit board 15 and supported by the support surface 113. The first printed circuit board 14 may comprise a metal layer 141. An electrical circuit and electronic components are disposed on a surface 142 of the first printed circuit board 14, while the metal layer 141 is disposed on another surface opposite to the surface 142. After the second printed circuit board 15 is received in the cavity 114, the first printed circuit board 14 is placed on the support surface 113 in a fashion with the metal layer 141 facing the cavity 114. The metal layer 141 is configured to effectively shield the electromagnetic energy emitted by the chips 151 so that the electronic components on the printed circuit board 16 as shown in FIG. 1 may be protected from influence by the electromagnetic energy. Preferably, the metal layer 141 can abut against the support surface 113. Such an abutting engagement design may not only prevent the escape of electromagnetic waves, but can also transfer the heat generated from the electronic components on the first printed circuit board 14 to the housing 11 so that the heat can be dissipated through the housing 11. In the present embodiment, the intermediate circuit can be separated to be disposed on the first printed circuit board 14 and the second printed circuit board 15, wherein the first printed circuit board 14 and the second printed circuit board 15 are electrically connected. Separating the intermediate circuit on two printed circuit boards 14 and 15 may allow the low noise block converter 1 to be more compact, reducing its volume and weight, requiring less material to construct it, and lowering its manufacturing cost. Further, the two printed circuit boards 14 and 15 each disposed with a portion of the low noise block converter 1 are arranged in a stacking manner, and a metal layer is disposed on a surface of the upper disposed printed circuit board 14 for shielding the electromagnetic energy from the chips on the lower disposed printed circuit board 15 such that the low noise block converter 1 may not need the disposition of a shield. Thus, the size, use of material, and cost can be further reduced. In the present embodiment, the metal layer 141 can be, but is not limited to, a copper layer. The metal layer 141 can be of any metal other than copper that can be disposed on a printed circuit board and used for electromagnetic interference shielding. In the present embodiment, the intermediate circuit is separated to be disposed on two printed circuit boards; however, the present invention is not limited to such an arrangement.

Referring to FIG. 2, the first printed circuit board 14 may further comprise an aperture 143 disposed with respect to one chip 151 on the second printed circuit board 15. The aperture 143 is configured to permit a test probe to pass through the first printed circuit board 14 for testing the chip 151 covered by the first printed circuit board 14. Usually, to shield the electromagnetic energy emitted by chips 151 on the second printed circuit board 15 received in the cavity 114, the first printed circuit board 14 should be configured to have a sufficient size that allows the metal layer 141 disposed thereon to cover the cavity 114. Under such a situation, after the first printed circuit board 14 and the second printed circuit board 15 are installed, the second printed circuit board 15 may be completely covered by the first printed circuit board 14 such that chips 151 on the second printed circuit board 15 cannot be accessed for testing. To resolve such issue, an aperture 143 is formed on the first printed circuit board 14 so that chips 151 on the second printed circuit board 15 can be tested. In the present embodiment, to prevent an electromagnetic wave from the chips 151 from propagating through the aperture 143, the diameter of the aperture 143 is configured to be one quarter of the wavelength of the electromagnetic wave.

Figure 3:
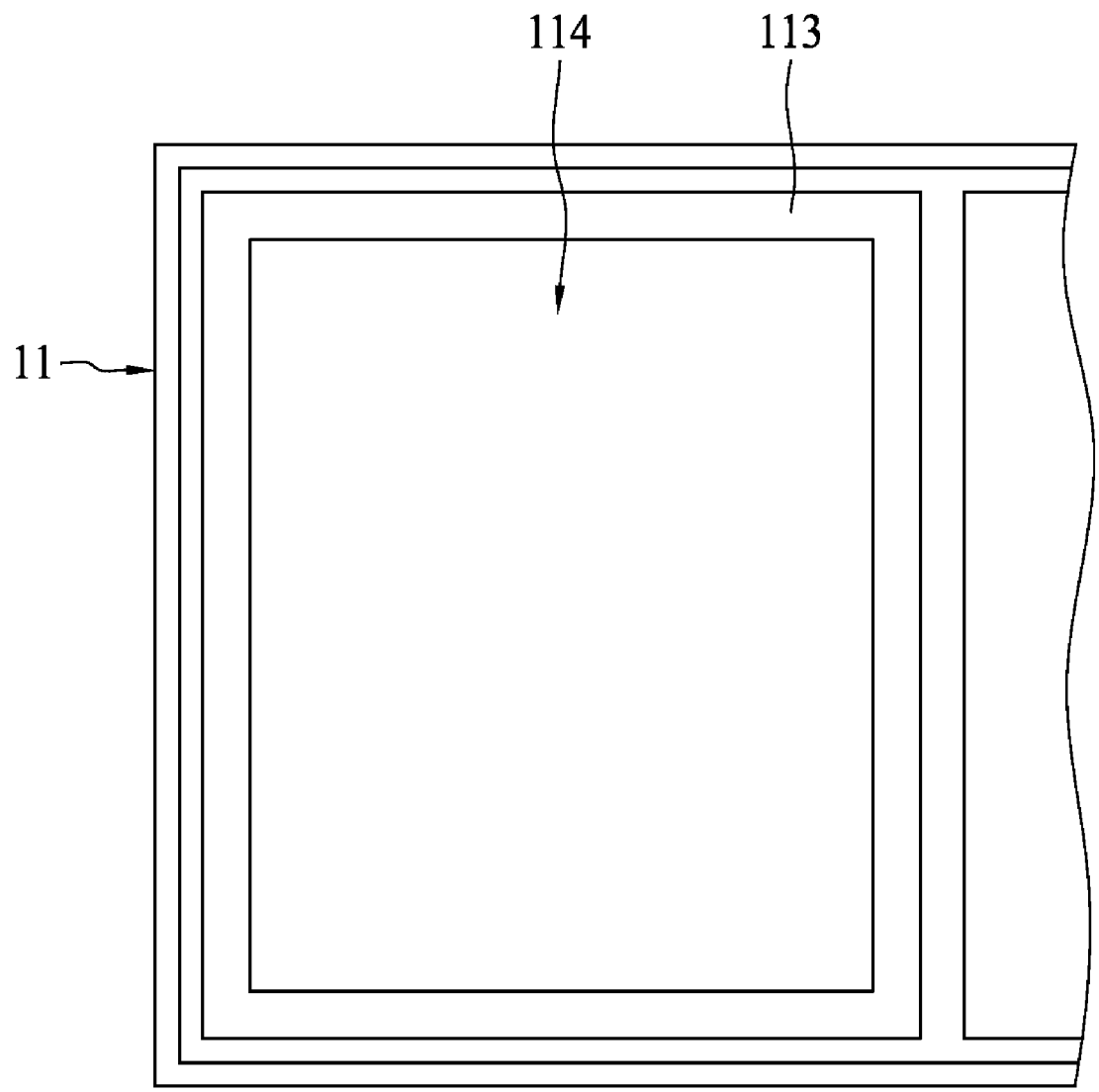
FIG. 3 is a top view showing the support surface in a housing according to one embodiment of the present invention.

FIG. 3 is a top view showing the support surface 113 in a housing 11 according to one embodiment of the present invention. Referring to FIGS. 2 and 3, the cavity 114 can preferably be formed in the support surface 113 such that the support surface 113 surrounds the opening of the cavity 114; however, the present invention is not limited to such a configuration. The support surface 113 is configured for supporting the first printed circuit board 14, for dissipating heat from the first printed circuit board 14, and for preventing electromagnetic interference of the first printed circuit board 14. Therefore, other configurations, for example, one in which the cavity 114 is disposed against one side of the first compartment 111, can also meet the requirements of the present invention.

The low noise block converter includes two stacked printed circuit boards, and a metal layer is disposed on the upper printed circuit board, thereby shielding the electromagnetic energy from the chips on the lower printed circuit board so that the low noise block converter does not need a shield, and consequently its size can be reduced. Furthermore, utilizing stacked printed circuit boards can further reduce the size of the low noise block converter. As such, the low noise block converter of the present invention has advantages such as compact size, light weight, use of less material, and low manufacturing cost.

The above-described embodiments of the present invention are intended to be illustrative only. Numerous alternative embodiments may be devised by persons skilled in the art without departing from the scope of the following claims.

What is claimed is:

1. A low noise block converter, comprising:
    a first printed circuit board including a metal layer disposed on a surface of the first printed circuit board;
    a second printed circuit board including at least one chip emitting an electromagnetic wave; and a housing, comprising:
  a support surface disposed within the housing, configured to support the first printed circuit board; and
  a cavity formed on the support surface, configured to receive the second printed circuit board;
wherein the first printed circuit board is disposed on the support surface with the metal layer facing the cavity for shielding the electromagnetic wave from the at least one chip;
wherein the second printed circuit board is enclosed by the housing and the first printed circuit board;
wherein the first printed circuit board further comprises an aperture disposed with respect to the at least one chip for allowing a test probe to test the at least one chip.

2. The low noise block converter of claim 1, wherein the metal layer abuts against the support surface.

3. The low noise block converter of claim 1, wherein the diameter of the aperture is one quarter of the wavelength of the electromagnetic wave.

4. The low noise block converter of claim 1, further comprising at least one protrusion disposed on a bottom surface defining the cavity and positioned with respect to the at least one chip for dissipating heat from the at least one chip.

5. The low noise block converter of claim 4, wherein the second printed circuit board includes at least one through-hole disposed below the at least one chip, and at least one thermally conductive pillar disposed in the at least one through-hole and engaging with the at least one chip and the protrusion.

6. The low noise block converter of claim 1, wherein the metal layer comprises a copper layer.

7. The low noise block converter of claim 1, wherein the first printed circuit board is electrically connected to the second printed circuit board.

8. The low noise block converter of claim 1, wherein the second printed circuit board comprises an intermediate frequency circuit.

9. The low noise block converter of claim 1, wherein the housing comprises aluminum.

10. The low noise block converter of claim 1, further comprising an electromagnetic wave absorbing material disposed on the at least one chip.

* * * * *